US009088330B2

(12) United States Patent
Richards

(10) Patent No.: US 9,088,330 B2
(45) Date of Patent: Jul. 21, 2015

(54) DISTRIBUTED LOCAL OSCILLATOR GENERATION AND SYNCHRONIZATION

(71) Applicant: CUBIC CORPORATION, San Diego, CA (US)

(72) Inventor: Wayne Edward Richards, La Mesa, CA (US)

(73) Assignee: Cubic Corporation, San Diego, CA (US)

(*) Notice: Subject to any disclaimer, the term of this patent is extended or adjusted under 35 U.S.C. 154(b) by 60 days.

(21) Appl. No.: 14/143,685

(22) Filed: Dec. 30, 2013

(65) Prior Publication Data

US 2014/0323073 A1 Oct. 30, 2014

Related U.S. Application Data

(60) Provisional application No. 61/815,555, filed on Apr. 24, 2013.

(51) Int. Cl.
| | | |
|---|---|---|
| *H04B 1/38* | (2006.01) | |
| *H04B 7/12* | (2006.01) | |
| *H03L 7/099* | (2006.01) | |

(Continued)

(52) U.S. Cl.
CPC .. *H04B 7/12* (2013.01); *H01Q 7/00* (2013.01); *H03L 7/099* (2013.01)

(58) Field of Classification Search
CPC ................................. H01Q 3/26; H01Q 3/267
USPC ........................ 455/562.1; 342/368, 371, 372
See application file for complete search history.

(56) References Cited

U.S. PATENT DOCUMENTS

| | | |
|---|---|---|
| 3,725,938 A | 4/1973 | Black et al. |
| 3,803,613 A | 4/1974 | Wright |

(Continued)

FOREIGN PATENT DOCUMENTS

| | | |
|---|---|---|
| WO | 97/21284 A1 | 6/1997 |
| WO | 99/23718 A1 | 5/1999 |

OTHER PUBLICATIONS

International Search Report and Written Opinion from PCT/US2014/017400 mailed on Jul. 10, 2014, 10 pages.

(Continued)

*Primary Examiner* — Lee Nguyen
(74) *Attorney, Agent, or Firm* — Kilpatrick Townsend & Stockton LLP

(57) ABSTRACT

Methods, systems, computer-readable media, and apparatuses for locally generating and synchronizing oscillation signals in a phased array system are presented. Multiple sub-array modules are used for collectively transmitting any number of beams on carrier frequencies, wherein each of the sub-array modules includes a transmit antenna, an oscillator configured to generate an oscillation signal, and a control element configured to phase lock the oscillation signal with other oscillation signals used in the system. The control element determines a phase difference measure that represents an average difference in phase between the oscillation signal and other oscillation signals used in the system, generates an average error signal, wherein the average error signal represents the phase difference measure, obtains information regarding oscillator trim signals applied with respect to the other oscillation signals generated in the system, and adjusts a frequency of the oscillation signal using the generated local oscillator trim signal.

20 Claims, 10 Drawing Sheets

(51) Int. Cl.
*H01Q 7/00* (2006.01)
*H04B 15/00* (2006.01)

(56) References Cited

U.S. PATENT DOCUMENTS

| | | | |
|---|---|---|---|
| 5,038,148 A | 8/1991 | Aoki et al. | |
| 5,274,844 A | 12/1993 | Harrison et al. | |
| 5,339,086 A | 8/1994 | Deluca et al. | |
| 5,369,663 A | 11/1994 | Bond | |
| 5,523,764 A * | 6/1996 | Martinez et al. | 342/372 |
| 5,764,187 A | 6/1998 | Rudish et al. | |
| 5,909,460 A | 6/1999 | Dent | |
| 6,157,681 A | 12/2000 | Daniel | |
| 6,246,366 B1 | 6/2001 | Speight | |
| 6,466,167 B1 | 10/2002 | Steinbrecher | |
| 6,686,879 B2 | 2/2004 | Shattil | |
| 6,728,294 B1 | 4/2004 | Kohno et al. | |
| 6,778,137 B2 | 8/2004 | Krikorian et al. | |
| 7,047,043 B2 | 5/2006 | Reilly et al. | |
| 7,129,890 B1 | 10/2006 | Redi et al. | |
| 7,277,051 B2 | 10/2007 | Falk et al. | |
| 7,345,629 B2 | 3/2008 | Dulmovits, Jr. et al. | |
| 7,394,424 B1 | 7/2008 | Jelinek et al. | |
| 8,203,483 B2 | 6/2012 | Richards | |
| 8,730,102 B2 | 5/2014 | Richards | |
| 2002/0034191 A1 | 3/2002 | Shattil | |
| 2004/0014429 A1 | 1/2004 | Guo | |
| 2004/0095287 A1 | 5/2004 | Mohamadi | |
| 2007/0126630 A1 | 6/2007 | Coppi et al. | |

OTHER PUBLICATIONS

"Field-programmable gate array." In *Wikipedia. The Free Encyclopedia*. Wikimedia Foundation, Inc. Mar. 12, 2008. Web. Retrieved Oct. 4, 2012, from <http://en.wikipedia.org/w/index.php?title=Field-programmable_gate_array>.

* cited by examiner

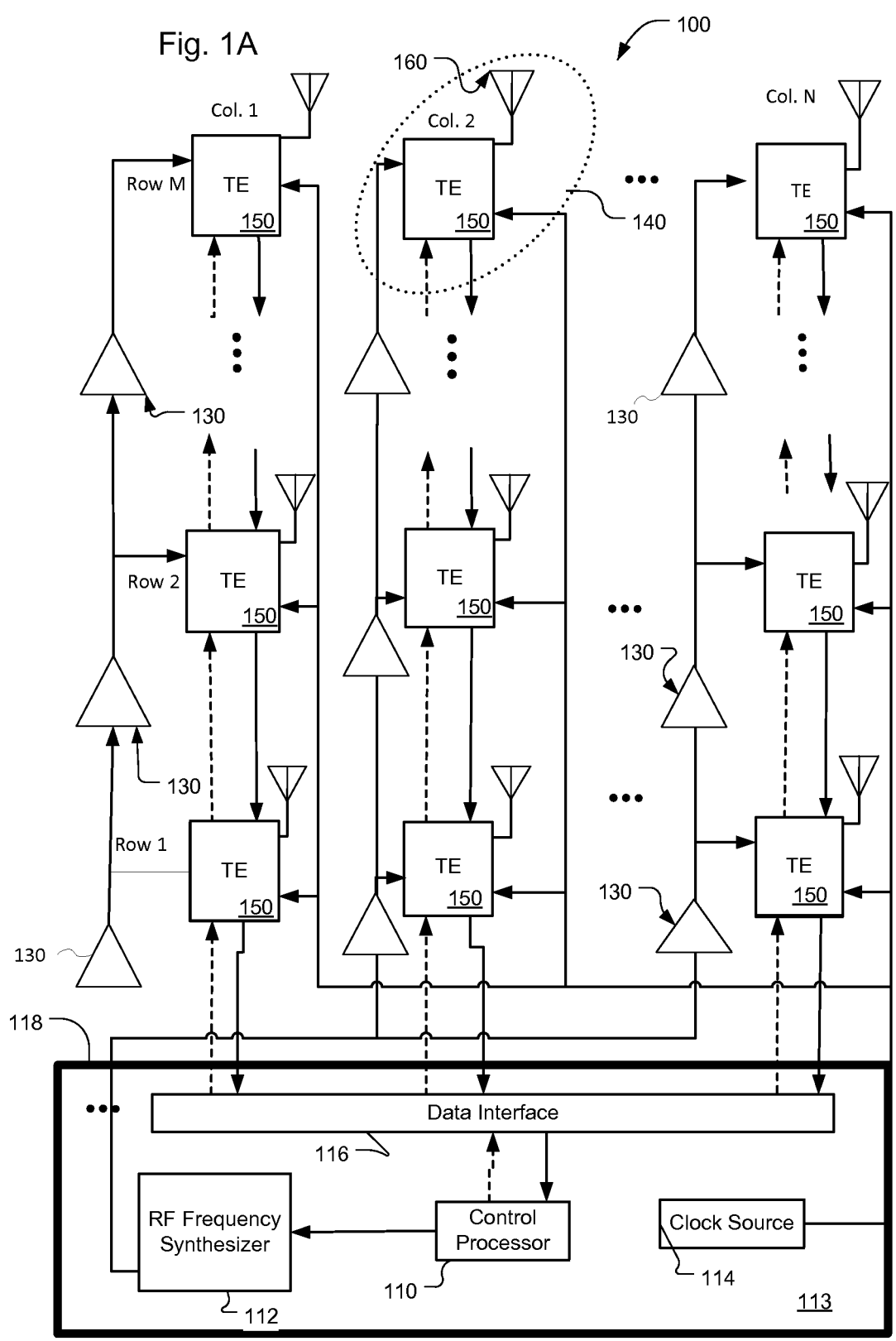

DISTRIBUTED LOCAL OSCILLATOR GENERATION AND SYNCHRONIZATION

This application is a non-provisional of U.S. Provisional Patent Application No. 61/815,555, filed Apr. 24, 2013, and entitled "Distributed Local Oscillator Generation and Synchronization" which is incorporated by reference in its entirety for all purposes.

BACKGROUND

Aspects of the disclosure relate in general to the synchronization of local oscillator (LO) signals for RF carrier tuning in a distributed phased array system.

Antenna arrays offer a way of increasing the data rate and the signal to noise ratio of a received or transmitted beam. When an antenna array is used to transmit a steered beam, the time, phase, and/or relative amplitude of the signal at each antenna is controlled in order to create a pattern of constructive and destructive interference. When receiving a steered beam, information from different antennas is combined in such a way that the expected pattern of radiation is preferentially observed.

When a signal is coming from a direction that is not orthogonal to the plane of a planar antenna array, the signal arrives at the different array antennas at different times. By adjusting the relative times that samples are taken from the received signal at the different array elements, the system can be electronically steered so as to reject energy not coming from the direction of the incoming signal. This increases the signal to noise ratio and can enable higher data rates. Similar time delay methods can be used to adjust the directionality of transmit signals.

Instead of adjusting transmission times and sampling times, phased arrays use waveforming techniques to adjust the relative phase offsets of the array elements during sampling of received signals or transmitting outgoing signals. The change in phase accomplishes an effect similar to the transmission and sampling delays, but the appropriate phase changes vary with carrier frequency. Thus, phased array systems are unsuitable for large bandwidth operations, and must be precisely tuned to a single carrier frequency.

BRIEF SUMMARY

The present disclosure provides techniques, methodologies and designs for implementing a phased array communication system or apparatus. The implementation may comprise multiple sub-array modules for collectively transmitting a beam on a common carrier frequency, wherein each of the sub-array modules includes a transmit antenna, an oscillator configured to generate an oscillation signal, a control element configured to phase lock the oscillation signal with other oscillation signals used in the system, and wherein the control element is further configured to, determine a phase difference measure that represents an average difference in phase between the oscillation signal and at least one of the other oscillation signals used in the system, generate an average error signal, wherein the average error signal represents the phase difference measure, obtain information regarding oscillator trim signals applied with respect to the other oscillation signals generated in the system, calculate an average of the oscillator trim signals, wherein calculating is based on the obtained information, generate a local oscillator trim signal based on the average error signal and the calculated average of the oscillator trim signals, and adjust a frequency of the oscillation signal using the generated local oscillator trim signal. Each sub-array module also includes a modulator component configured to modulate carrier waveforms derived from synchronized oscillation signals, and the apparatus further includes a transmit component configured to transmit modulated carrier waveforms.

The present disclosure also details a method for frequency synchronizing and phase locking carrier signals in a phased array system, the system including multiple antennas, and the method comprising, tuning multiple array elements to a common carrier frequency, wherein tuning is performed locally at each array element by synchronizing a locally generated oscillation signal with other oscillation signals used in the system, and wherein synchronizing includes determining a phase difference measure that represents an average difference in phase between the oscillation signal and at least two other of the oscillation signals, providing an average error signal, wherein the average error signal represents the phase difference measure, obtaining information regarding oscillator trim signals applied with respect to the other oscillation signals used in the system, calculating an average of the oscillator trim signals, wherein the average is calculated based on the obtained information, generating a local oscillator trim signal, wherein the local oscillator trim signal is generated based on the average error signal and the calculated average of the oscillator trim signals, adjusting a frequency of the oscillation signal using the generated local oscillator trim signal, and simultaneously transmitting information at the antennas, wherein the information is transmitted using the common carrier frequency.

BRIEF DESCRIPTION OF THE DRAWINGS

Aspects of the disclosure are illustrated by way of example. In the accompanying figures, like reference numbers indicate similar elements, and:

FIGS. 1A and 1B illustrate certain aspects of a phased array system. FIG. 1A illustrates components involved in transmitting, and FIG. 1B illustrates components involved in receiving.

FIG. 2A depicts transmitting elements, and FIG. 2B depicts receiving elements.

FIG. 3A depicts transmitting elements and FIG. 3B depicts receiving elements.

DETAILED DESCRIPTION

Figure 1B:
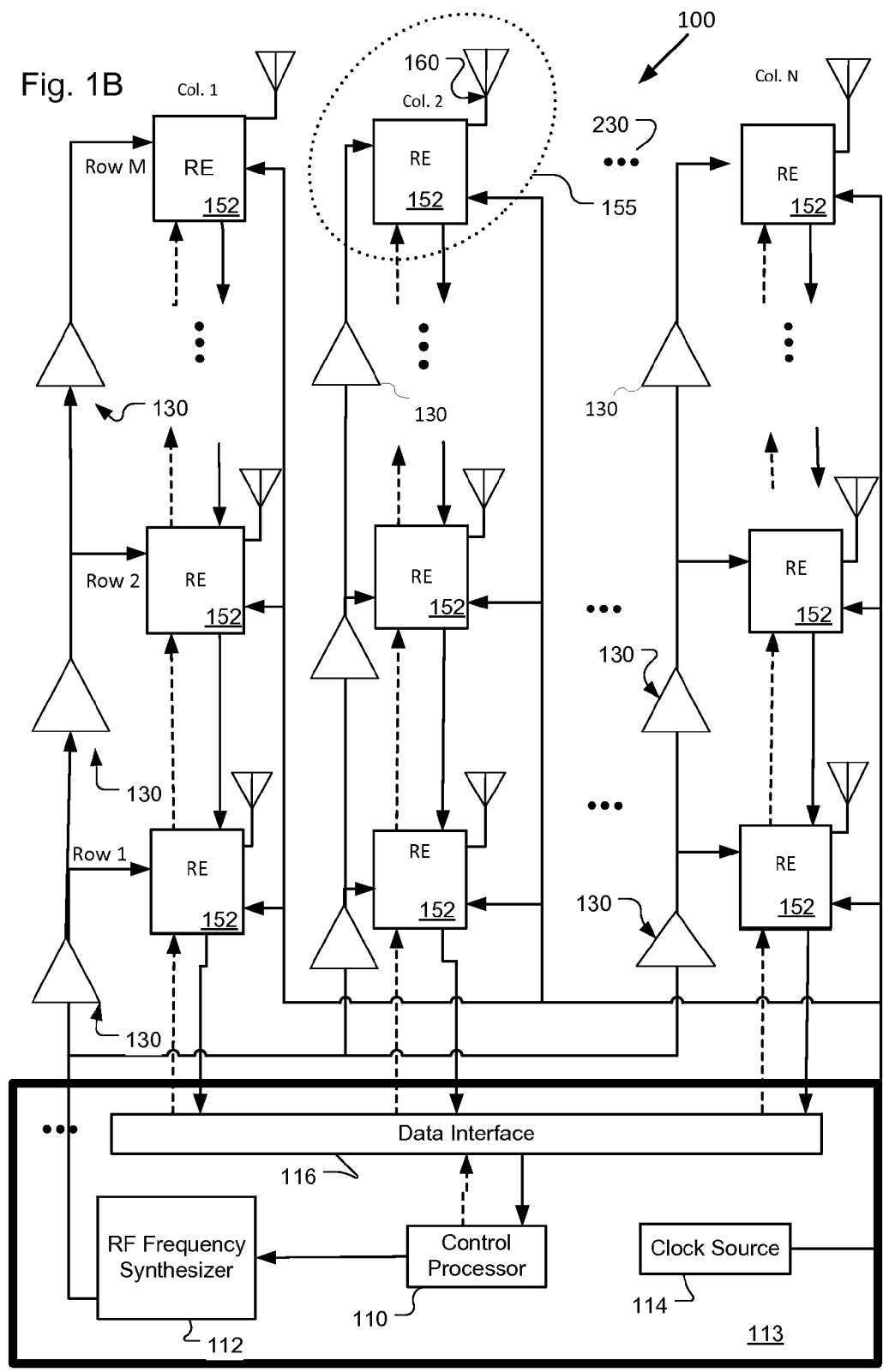

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

In a phased array system, certain complexities become significant as the number of array elements (antennas and associated control elements) is increased. This growth in complexity can be detrimental with regards to system characteristics such as cost, size, weight, power consumption and heat produced by the system, for example.

One approach to address certain challenges associated with large numbers of array elements is to use distributed signal processing. In this arrangement, signal processing tasks, including modulation and demodulation for the various antennas, are distributed amongst several transmit modules and receive modules, each of which is implemented using an FPGA.

Each transmit module and receive module is coupled to a small number of antenna elements and provides signal processing associated with signals transmitted and received at those antenna elements, respectively. A central processor provides overall control functionality. For example, the central processor may perform calculations to determine the phase offsets between antenna elements, and provide this information to the transmit modules which effectuate the offsets. In phased array systems with this type of distributed processing, an oscillation signal may be provided to each transmit module and receive module so that modulation and demodulation may be performed. Oscillation signals should be synchronized from one module to prevent both receiver and transmitter degradation.

FIGS. 1A (transmit side) and 1B (receive side) are simplified diagrams of a distributed phased array system 100 that incorporates distributed processing performed by transmit modules 140 (only one of the several depicted transmit modules is specifically enumerated) and receive modules 155 (only one enumerated). Each transmit module 140 and receive module 155 in phased array system 100 is composed of a transmit array element 150 and a receive array element 152, respectively. In addition to a transmit array element 150 and receive array element 152, each transmit module 140 and receive module 155 includes an antenna 160.

At each transmit module 140, the transmit array element 150 performs signal processing and control tasks associated with signals transmitted there. Similarly, at each receive module 155, the receive array element 152 performs signal processing associated with signals received there. The distributed phased array system 100 includes a central processing unit 113. The central processing unit 113 includes a control processor 110, an RF synthesizer 112, a clock source 114 and the data interface 116.

The control processor 110 generates and sends control information to the transmit modules 140 and receive modules 155. The control information includes timing information used by the transmit modules 155 to phase adjust and scale waveforms as required for beamsteering. Similarly, with regards to the receive modules 155, the control information includes information used by the receive modules 155 to appropriately phase shift received signals prior to received signals being sampled for demodulation. The control processor 110 communicates both data to be transmitted by the transmit array elements 150 and the control information (e.g., beamforming transmit delay times, complex weights, antenna group identifiers, etc.) to the transmit modules 140. The data and control information is distributed by the data interface 116. Conversely, at each receive array element 152, after the receive module 155 has performed demodulation of a received signal, the received data is communicated to the control processor 110.

The clock source 114 provides a clock signal which is distributed to each of the transmit modules 140 and receive modules 155. The clock signal enables phase offsets to be applied based on a common time reference to which all transmit and receive modules 140, 155 are synchronized. The clock signal can be in the form of a square wave.

The data interface 116 receives data from the central processing unit 113, and distributes this data to the transmit modules 140 which will ultimately transmit the data. Similarly, the data interface 116 receives received signal data from the receive modules 155 following demodulation, and provides this data to the control processor 110. The data interface 116 also distributes the previously-described control information to the transmit array elements 150 and receive array elements 152. Additionally, the data interface 116 receives status information from the transmit array elements 150 and receive array elements 152. The status information is then communicated to the control processor 110. The status information can include received signal strength measures, element temperatures, etc.

When data control or status information is communicated to the transmit modules 140 and receive modules 155 from the data bus or vice versa, the communication involves forwarding the information from array element to array element until it is received at the intended recipient array element or the data interface 116. Thus, by way of example, if the array elements are disposed in a row and column arrangement, when a receive array element is in the third-furthest row from the central processing unit 113, data for this particular array element may be communicated by the data interface 116, and relayed by the first and second array element within the same column as the destination array element.

Each of the transmit modules 140 includes a processor and amplifier (both not shown) coupled to the transmit antenna 160. Each transmit module 140 processor receives encoded data from the data interface 116 and converts the encoded data into modulation symbols. In idealized operations, all transmit module 140 processors also access an oscillation signal having a frequency equal to the carrier frequency intended to be tuned, such that the oscillation signals are exactly synchronized in frequency and phase from one transmit module 140 to the next. Each processor then uniquely phase shifts the oscillation signal it has accessed. At each processor, the phase shifting is based on the control information provided by the control processor 110. The processor then modulates the shifted carrier waveform with data received from the data interface 116.

Each of the receive modules 155 also includes an amplifier, analog to digital converter, and processor (not shown) coupled to the antenna 160. Each receive module 155 amplifies the signal received at the antenna 160, and the analog to digital converter digitizes the signal.

In ideal operations, all receive module 155 processors also access an oscillation signal having a frequency equal to received signal carrier frequency intended to be tuned, such that the oscillation signals are precisely synchronized in frequency and phase from one receive module to the next. Each receive module 155 then uniquely phase shifts the waveform it has accessed, based on the control information provided by the control processor. The phase shifted waveform is then used to demodulate the signal by removing the carrier component.

Beam steering effectiveness can depend on each involved transmit array element 150 being precisely tuned to the same carrier frequency as every other transmit array element 150. The same precision tuning is equally important with respect to the receive array elements 152 involved in beamforming. Moreover, across all the transmit array elements (when transmitting) 150, or across all receive array elements (when receiving) 152, each oscillation signal used in tuning must be synchronized (e.g. in phase and frequency) with every other such signal prior to being phase shifted. Loss of synchronization at an array element causes the signal received or transmitted there to be incoherently added to the signals of the other antennas. Certain of the novel techniques, methods and systems disclosed herein relate to the generation and synchronization of the various oscillation signals used for modulation and demodulation in a phased array system.

Before addressing those techniques, however, it is important to note that the depiction of phased array system 100 reflects a previously recognized design feature that has been used in an attempt to generate synchronized oscillation signals in phased array systems. Phased array system 100 is presented so that the techniques and design features of the present invention may be explained by way of contrast with that system.

As depicted in FIG. 1, RF synthesizer 112 generates oscillation signals for modulation and demodulation at the transmit and receive array elements 150, 152. RF synthesizer 112 also generates oscillation signals used for pre-modulation and post-demodulation frequency translation of baseband signals. RF synthesizer 112 generates these signals by synthesizing an oscillation signal generated by an oscillator (not shown) within central processing unit 113. Although not explicitly depicted in FIG. 1, it should be understood that RF synthesizer 112 generates at least one such oscillation signal for each tuned frequency (e.g. a separate oscillation signal for each carrier frequency to be tuned within the system 100). Each such oscillation signal is split and amplified multiple times, so that it may be provided to the various transmit array elements 150 or receive array elements 152 which will collectively be involved in beamsteering or beamforming, as the case may be.

For example, in the phased array system 100 depicted in FIGS. 1A, 1B, when a group of transmit array elements 150 will be used to form a single beam, the RF synthesizer 112 generates an oscillator signal for distribution to each transmit array element 150 of the group. The oscillator signal is split, and the resulting signals are then provided to the transmit array elements 150. Prior to being used at the transmit array elements 150, the various oscillation signals are periodically amplified by amplifiers 130 to compensate for losses inherent in distributing the signals.

When a distributed phased array system 100 incorporates a large number of transmit array elements 150, losses and phase distortion associated with distributing the various oscillation signals may be significant. Because of these losses, multiple stages of amplification may be necessary. For example, when transmit or array elements 150 disposed in a row that is substantially separated from the central processing unit 113, the oscillation may be amplified many times prior to being used for modulation or demodulation.

To minimize the phase distortion to an acceptable level, expensive components such as phase matched cables and waveguides may also be needed. However, these measures may be prohibitive with regards to the components, cost or power required.

Moreover, as can be understood with reference to phased array system 100, a phased array system that distributes a centrally generated oscillation signal may be highly vulnerable to the failure of any one amplifier, array element, or other component on which distribution of the oscillation signal is dependent. For example, in the example phased array system 100, the failure of the first amplifier 130 in column 1 would prevent the oscillation signal from being distributed to each of the M transmit array elements and receive array elements 150, 152 in the column. In such an event, the transmit array elements 150 would be unable transmit at the carrier frequency, thereby causing beam degradation. The receive array elements 152 would similarly be unable to demodulate information, thereby degrading the received beam.

Additionally, even when all components of phased array system 100 are operating properly, each amplifier introduces phase noise. This phase noise may result in the transmitted or received signal at one array element becoming incoherent with respect to signals at other array elements. Any amount of incoherence decreases the signal to noise ratio of the beam, and significant incoherence can cause complete beam degradation and loss of the signal. Thus, when a phased array system design incorporates a centrally generated oscillation signal that is split, amplified and distributed, the added phase noise caused by amplification may be significant enough to prevent the design from being scaled to accommodate a large number of antennas.

Figure 2A:
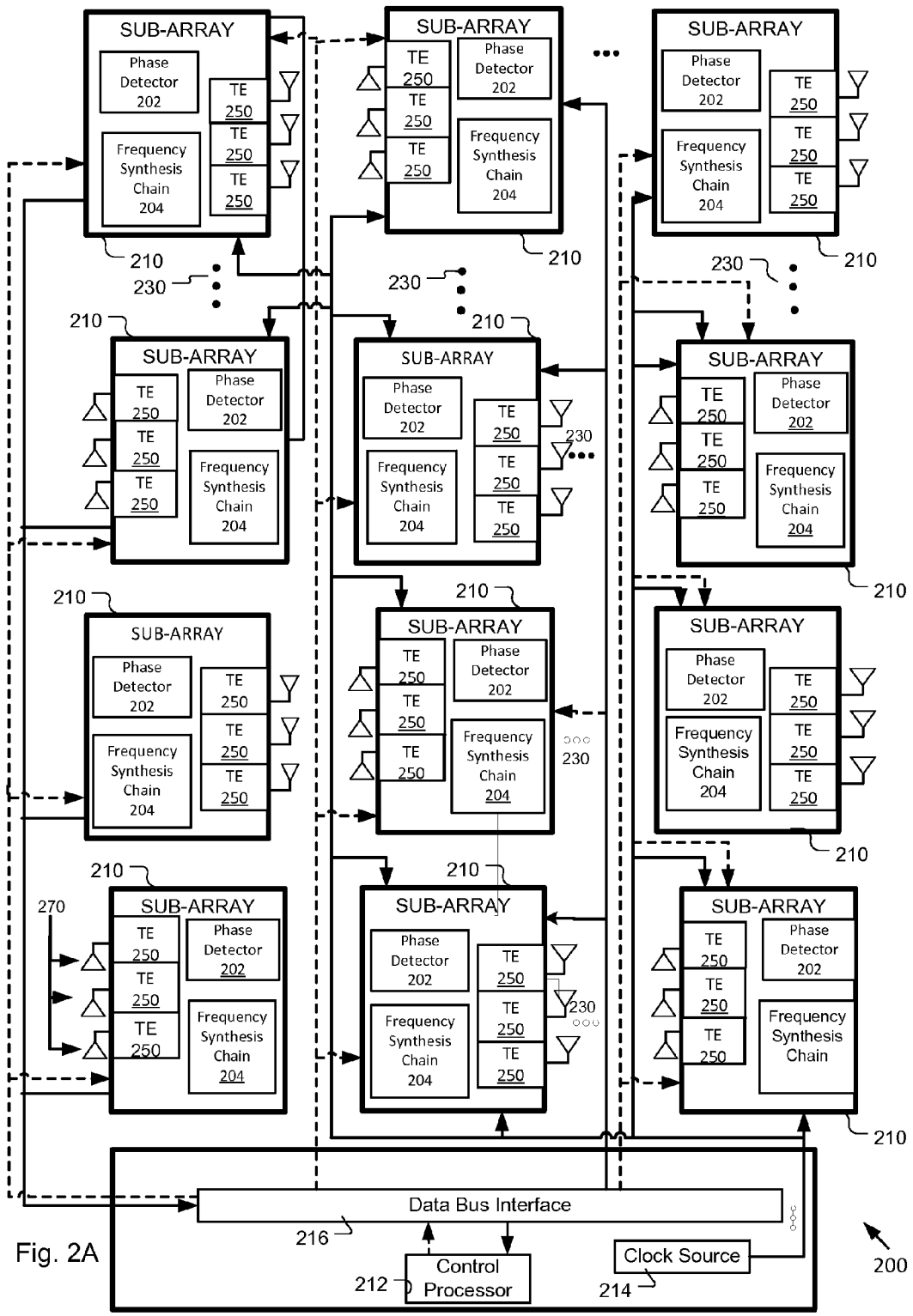
FIGS. 2A and 2B illustrate certain aspects of an example phased array system in which certain techniques of the present disclosure are implemented.

The present disclosure describes a distributed phased array system in which local oscillation signals are generated at various locations throughout the system, such that each signal is synchronized with every other signal. The general configuration of this distributed phased array system 200 is depicted in FIG. 2A (transmit side) and FIG. 2B (receive side). The overall system 200 is composed of multiple sub-array modules 210 (hereinafter "sub-arrays"), each of which is configured to generate an oscillation signal, as well as synchronize the oscillation signal with all other oscillation signals similarly generated at other sub-arrays 210 throughout the system 200.

Figure 2B:
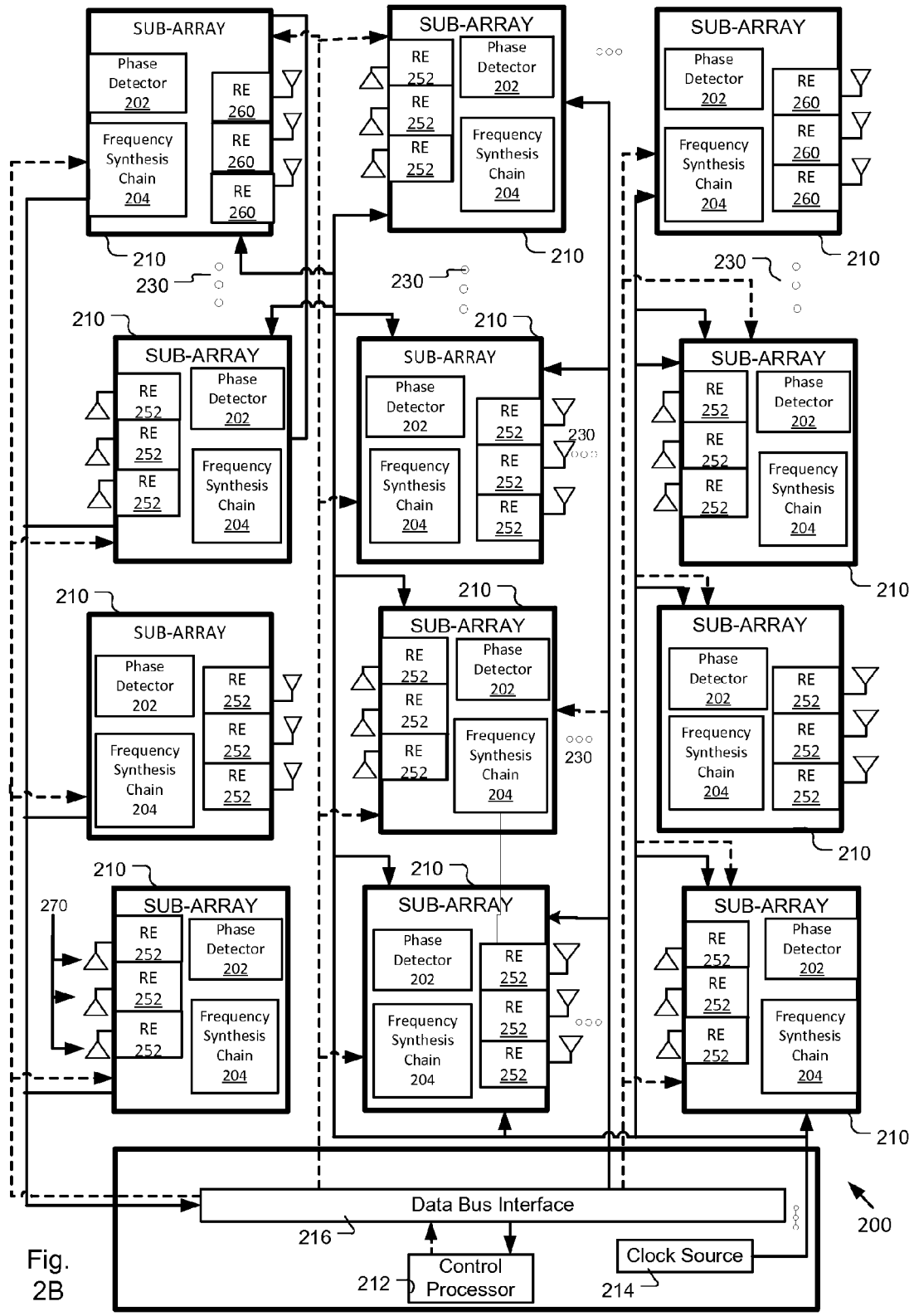

As depicted in FIG. 2A and FIG. 2B, each sub-array 210 communicates with control processor 212 through data interface 216. A clock source 214 provides a clock signal that is used by the sub-arrays 210 for various time synchronization purposes. Each subarray 210 includes either multiple transmit array elements 250 (abbreviated "TE" in FIG. 2A) or multiple receive array elements 252 (abbreviated "RE" in FIG. 2B), and an antenna 270 attached to each transmit and receive array element 250, 252. Each sub-array 210 also includes a frequency synthesis chain 204 for generating the oscillation signals used by the transmit and receive array elements 250, 252 in the process of performing frequency translation of data to or from baseband, and performing modulation and demodulation.

Each sub-array 210 also includes a phase detector block 202 for performing phase detection used in synchronizing the oscillation signal. FIGS. 2A, 2B illustrate only one of many possible arrangements of sub-arrays 210 with respect to transmit and receive array elements 250, 252. As an alternative to the depicted configuration of system 200, individual sub-arrays 210 may include both transmit and receive array elements 250, 252, or may include numbers of transmit or receive array elements 250, 252 which differ from the depiction. In fact, the scope of this disclosure is intended to cover phased array systems with sub-arrays that include any number or combination of transmit or receive array elements.

One difference in transmit and receive array elements 250, 252 of system 200 and the transmit and receive array elements 150, 152 of system 100 relates to the respective sources of the oscillation signals used by the elements to frequency translate data and perform modulation and demodulation. Whereas, in system 100, the transmit and receive array elements 150, 152 are provided with a split and amplified version of a signal generated in central processing unit 113, each of the transmit and receive array elements 250, 252 in system 200 are provided with a local oscillation signal generated within a frequency synthesis chain 204. In other respects, transmit array elements 250 in system 200 may be designed and function similarly to transmit array elements 150 in system 100. Thus, each transmit array element 250 may include a transmit a processor (not shown) that modulates the oscillation signal with which it is provided, and applies a phase shift and weight to the modulated signal. The applied phase shifts and weightings differ from each transmit array element 250 to the next. At any one transmit array element 250, the amount of phase shift and weighting applied depends on the direction of the beam to be formed, and the position of the antenna 270.

Also, receive array elements 252 in system 200 may be designed and function similarly to receive array elements 152 in system 100. Thus, the receive array elements 252 may demodulate received signals using the procedures described above with regards to receive array elements 152 of system 100. A more detailed description of certain signal processing techniques which may be employed at transmit and receive array elements 250, 252 may be found in U.S. Pat. No. 8,203,483, entitled "Digital Beamforming Antenna And Datalink Array", which is expressly incorporated by reference in its entirety for all purposes.

The depiction in FIGS. 2A and 2B shows one of many possible modular arrangements of sub-arrays 210 in a system 200 covered by the scope of this disclosure. In this arrangement, the various sub-arrays 210 are aligned vertically and horizontally so as to form rows and columns of sub-arrays 210. Aside from the fact that the components used to configure transmit array elements 250 may be different from the components used to configure receive array elements 252, the various sub-arrays 210 may reflect a common design and be created using identical components in all other respects.

FIG. 2 is intended to demonstrate that because the arrangement of components in system 200 is modular, the arrangement may be applied in a phased array system 200 having any number of sub-arrays 210, and without entailing any change to the manner in which sub-arrays 210 are designed or disposed from one to the next.

So as to better show the modularity of system 200, FIG. 2 depicts variable array size at 230 to suggest the possibility that phased array system 200 may include any number of other sub-arrays 210 not shown explicitly. Accordingly, it shall be understood that a modular design such as the one shown in FIG. 2 may include any number of sub-arrays 210, transmit array elements 250 and receive array elements 252, and the scope of this disclosure shall not be limited in any way with regards to the size or number of sub-arrays 210 or array elements 250, 252 used in a phased array system.

Within each sub-array 210, the frequency synthesis chain 204 includes a voltage controlled reference oscillator (not shown) that generates a reference oscillation signal. Each frequency synthesis chain 204 further includes a tunable synthesizer (not shown) that receives the reference oscillation signal and uses it to generate a local oscillation signal at a desired frequency. At each sub-array 210, the local oscillator signal is split as needed, so that a copy can be provided for modulation, demodulation, or frequency translation to be performed separately at each transmit array element 250 or receive array element 252, as the case may be.

At each sub-array 210, the phase detector block 202 and frequency synthesis chain 204 operate collectively as a phase locked loop, and control the local oscillator signal by changing the reference oscillator trim signal to increase or decrease its oscillation frequency. Each phase locked loop trims the reference oscillator frequency based on an average of the phase differences between the local oscillator signal and the local oscillation signals generated at neighboring sub-arrays 210, and commands small frequency adjustments to the reference oscillator signal so as to minimize the average.

As will be explained in greater detail with regards to later drawings, the system 200 further incorporates a feature for minimizing frequency drift and instability that might otherwise be occasioned by the frequency trimming of any one of the reference oscillators, or an increase or decrease of local oscillator frequency due to noise or performance degradation. The feature restrains frequency drift without critical dependence on any single reference oscillator. Using this methodology, the reference oscillator trim signaling of each phase locked loop is further controlled based on an ensemble average of all the frequency trim signals at the various phased locked loops in all sub-arrays 210.

Over time, at each phase locked loop, the reference oscillator trim signal voltage is increased or decreased so as to cause the ensemble average to be altered in the direction of the nominal untrimmed voltage (e.g. the voltage that results in a center frequency) characteristic of the reference oscillators used in the system 200. In this way, the conventional phased locked loop dependence on a single oscillation signal as a reference for synchronization is avoided. The various phase locked loops instead synchronize to the average untrimmed frequency of the reference oscillators. Synchronizing the ensemble in this way serves to reduce the effects of localized noise and prevents localized frequency drifts from causing additional frequency drifting at other oscillators throughout the system.

Because each oscillation signal is generated locally, there is no need to distribute any one oscillation signal to disparate transmit and receive array elements 250, 252. As a result, various stages of amplification may be avoided, as well as phase-matched cabling and waveguides.

Figure 3A:
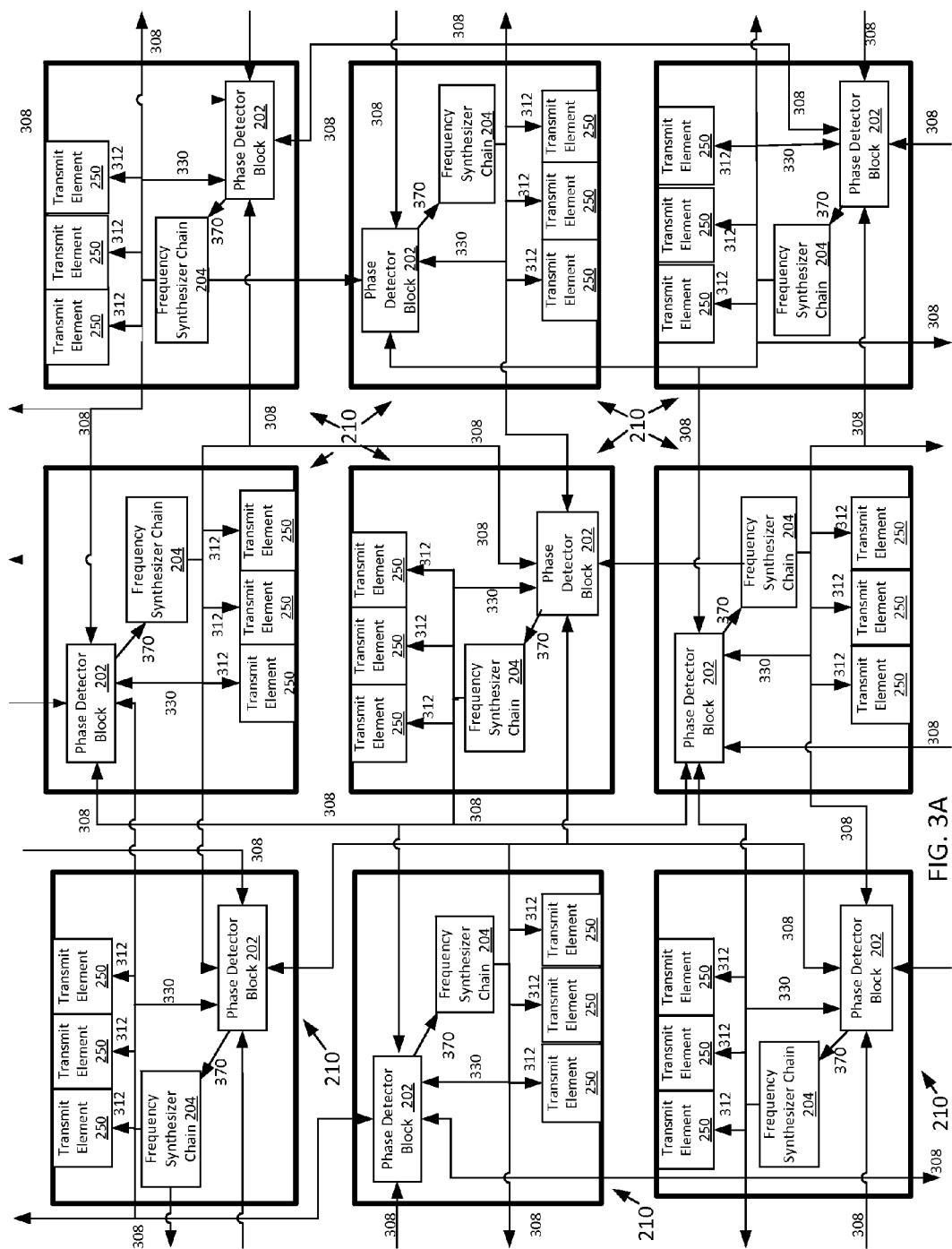
FIGS. 3A and 3B illustrate an exemplary and generalized arrangement of certain components of a phased array system in which aspects of the present disclosure are incorporated.
Figure 3B:
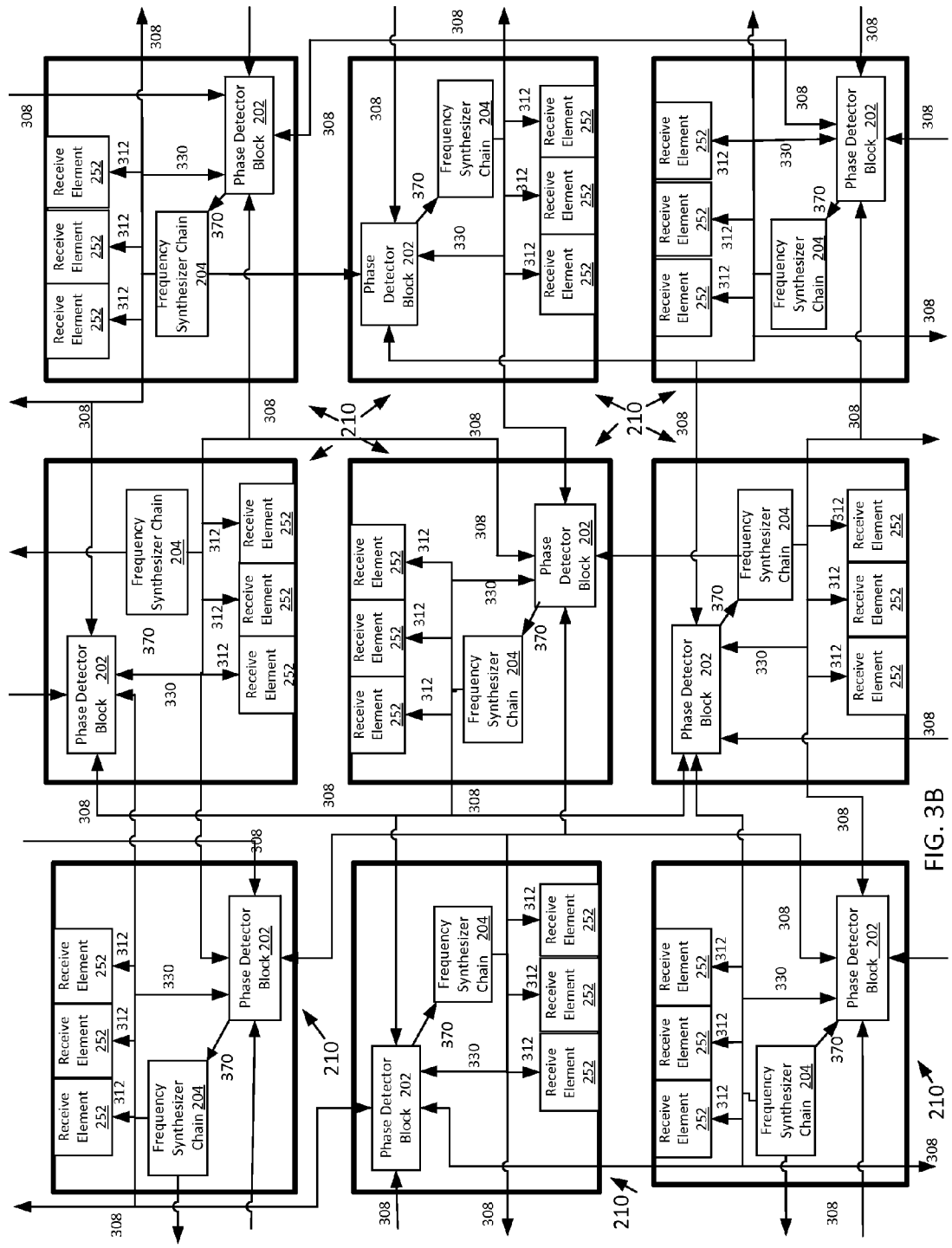

FIGS. 3A and 3B provide an additional generalized illustration of the distributed phased array communications system 200 previously depicted in FIG. 2A and FIG. 2B. Certain of the components shown in FIGS. 2A and 2B are not illustrated in FIGS. 3A, 3B for ease of depiction. However, whereas FIGS. 2A, 2B do not illustrate certain facets of signaling between sub-arrays 210 and sub-array components, FIGS. 3A, 3B are intended to depict certain aspects of this signaling in a generalized manner.

Figure 4:
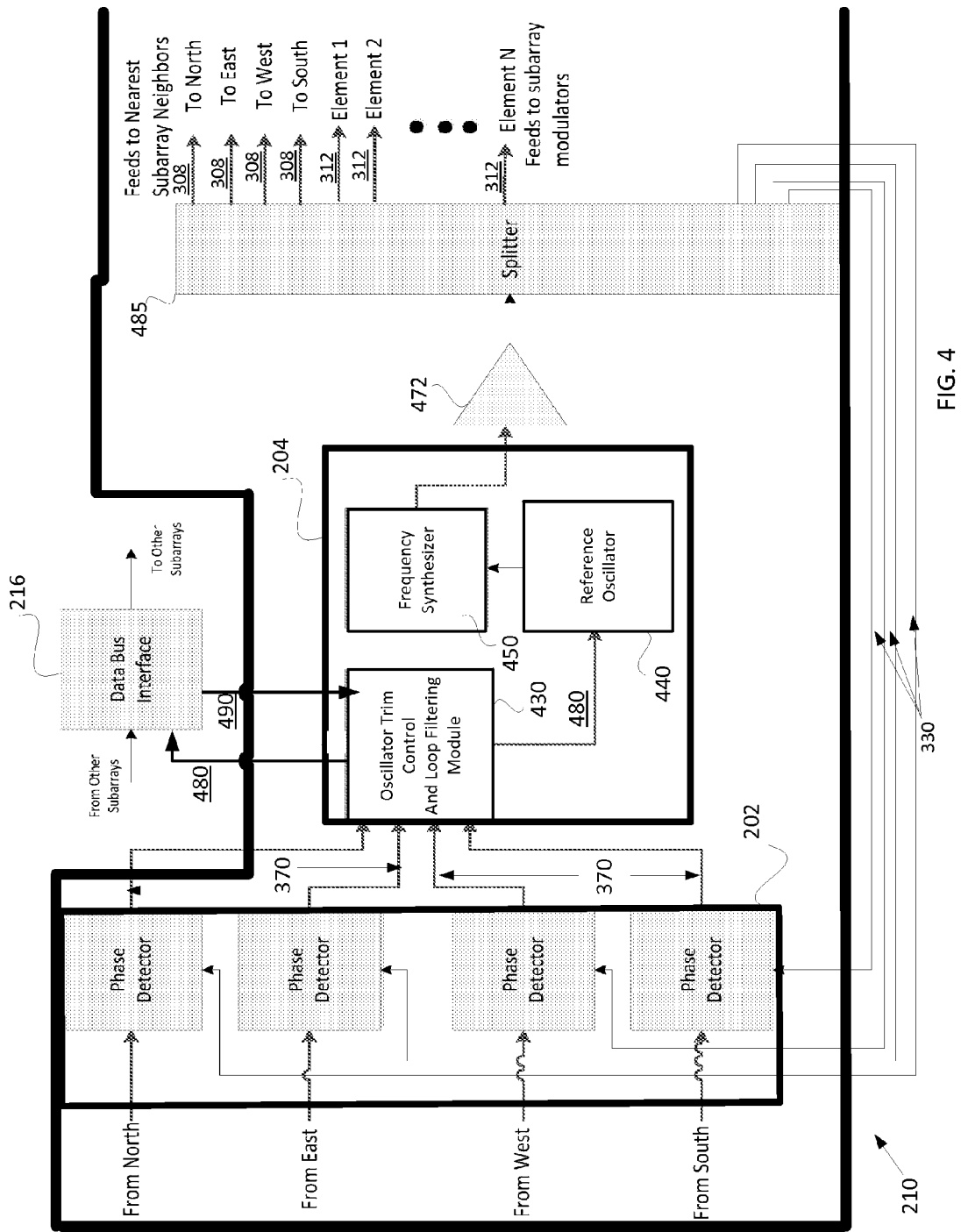
FIG. 4 illustrates an exemplary and generalized arrangement of certain components of a phased array system in which aspects of the present disclosure are incorporated.

For ease of understanding, FIGS. 3A and 3B will be explained together, and the explanation will reference FIGS. 2A, 2B and FIG. 4. Whereas FIGS. 3A and 3B provide a simplified depiction of multiple sub-arrays 210 within system 200 and the connections between sub-array elements in neighboring sub-arrays 210, FIG. 4 is a more focused view of a single sub-array 210, the components therein, and certain of the operations which these components perform. As a result of the modular design of system 200, the sub-array 210 depictions in FIGS. 3A, 3B and FIG. 4 reflect a design and disposition that is applicable to all sub-arrays 210 in the system 200. Thus, each sub-array 210 depicted in FIGS. 3A and 3B may be configured in accordance with the design shown in FIG. 4.

As was depicted in FIGS. 2A, 2B and mentioned previously, each of the sub-arrays 210 shown in FIGS. 3A and 3B includes a phase detector block 202, frequency synthesis chain 204 and antenna 270. Each frequency synthesis chain 204 includes several components which are omitted from the illustration in FIG. 2, but which are shown in FIG. 4. These components include a digital oscillator trim control and filtering module 430 (hereinafter, this component will be referred to simply as the "control and filtering module"), a voltage controlled reference oscillator 440 (or any other oscillator capable of providing an oscillation signal with controllable frequency) and a frequency synthesizer 450. In each sub-array 210, the reference oscillator 440 generates the local oscillation signal, which is outputted to the frequency synthesizer 450. The frequency synthesizer 450 uses this inputted oscillation signal to generate a waveform for use in modulation or demodulation at the array elements 250, 252 of the sub-array 210. Additionally or alternatively, the frequency synthesizer 450 may use the oscillation signal to generate a waveform that is used for frequency translation of a baseband signal prior to the process of modulation, or for moving a baseband signal to an intermediate frequency after demodulation, and prior to the baseband signal being decoded.

At each sub-array 210, the control and filtering module 430 is a digital control mechanism that outputs a trim signal 480. The trim signal 480 is used to adjust the frequency of the reference oscillator 440 and is also provided to data interface 216 so that the signal may be referenced by control and filtering modules 430 in other sub-arrays 210 during the process of controlling the oscillation signals there. Neither trim signal 480 nor communication of the trim signal 480 to data interface 216 is depicted in FIG. 3. However, these elements are shown in FIG. 4.

As will be explained in greater detail in subsequent paragraphs, each control and filtering module 430 receives error signals 370 from the phase detector block 202. The error signals 370 are averaged to obtain a representation of the average phase difference between the local oscillation signal and oscillation signals generated at neighboring sub-arrays 210. The control and filtering module 430 also receives information 490 representing the reference oscillator control trim signals 480 applied at other sub-arrays 210 in the system 200, and controls the oscillator trim control signal 480 based on both the error signals 370 and the oscillator control trim signals applied at the other sub-arrays 210. By controlling the oscillator trim signal 480 in this way, the trim signal is prevented from causing frequency drift to occur in the local oscillator signal.

FIGS. 3A and 3B show that within each sub-array 210, the transmit or receive array elements 250, 252 are coupled to the frequency synthesizer 450 output via an amplifier 472 and splitter 485. Through this connection pathway, each transmit or receive array element 250, 252 is provided with a waveform as needed for modulation, demodulation, or frequency translation of the baseband data signal. In FIG. 3, each instance of the waveform being provided to an array element is shown at 312.

With regard to each pair of immediately neighboring sub-arrays 210 shown in FIG. 3, three array elements 250, 252 associated with one of the sub-arrays 210 are depicted below the sub-array 210, while the transmit and receive array elements 250, 252 associated with the other of the sub-arrays are depicted above that sub-array 210. It should be understood that this method of depiction was selected so that FIGS. 3A and 3B could be presented in an organized fashion, and is not intended to provide any demonstration or suggestion with regards to the location of array elements 250, 252 relative to any other sub-array 210 components. The scope of this disclosure covers phased array systems regardless of the number of antenna elements associated with individual sub-arrays 210, and regardless of the methodology or arrangement pattern used to place antenna elements relative to other antenna elements or sub-array components.

At 308, the outputted local oscillator signal provided to the transmit and receive array elements 250, 252 is also distributed to phase detector blocks 202 at immediately neighboring sub-arrays 210. Thus, it should be understood that, with respect to each frequency synthesis chain 204, the local oscillator signals 312 provided to array elements 250, 252 are substantially the same waveforms depicted at 308 as being provided to phase detectors blocks 202 in neighboring sub-arrays 210. However, each local oscillator signal 312 is used for modulation or demodulation at an array element 250, 252 or for pre-modulation or post-modulation frequency translation, while each waveform shown at 308 is used for the purpose of oscillation signal synchronization at a neighboring sub-array 210. Thus, the design and configuration depicted in FIGS. 3A, 3B enables each sub-array 210 carrier waveform to be provided to the phase detector blocks 202 within immediately neighboring sub-arrays 210, and to be used for synchronizing the local oscillator signals generated at these sub-arrays 210 through trimming of the reference oscillator 440 signals locally generated there.

As shown in FIGS. 3A, 3B, each sub-array 210 phase detector block 202 is provided with copies of the local oscillator waveform generated at immediately neighboring sub-arrays 210. Additionally, as previously mentioned with regards to FIG. 4, each sub-array phase detector block 202 is also provided, via a feedback signal 330, with the local oscillator signal generated by the sub-array 210 frequency synthesis chain 204. Thus, with regard to each frequency synthesis chain 204 output, it should be understood that the signals 308, 312 and 330 are copies of the same oscillation signal, which is split at the output. However, these signals are labeled using different numbers because of the distinct operations with which the signals are associated.

Figure 5:
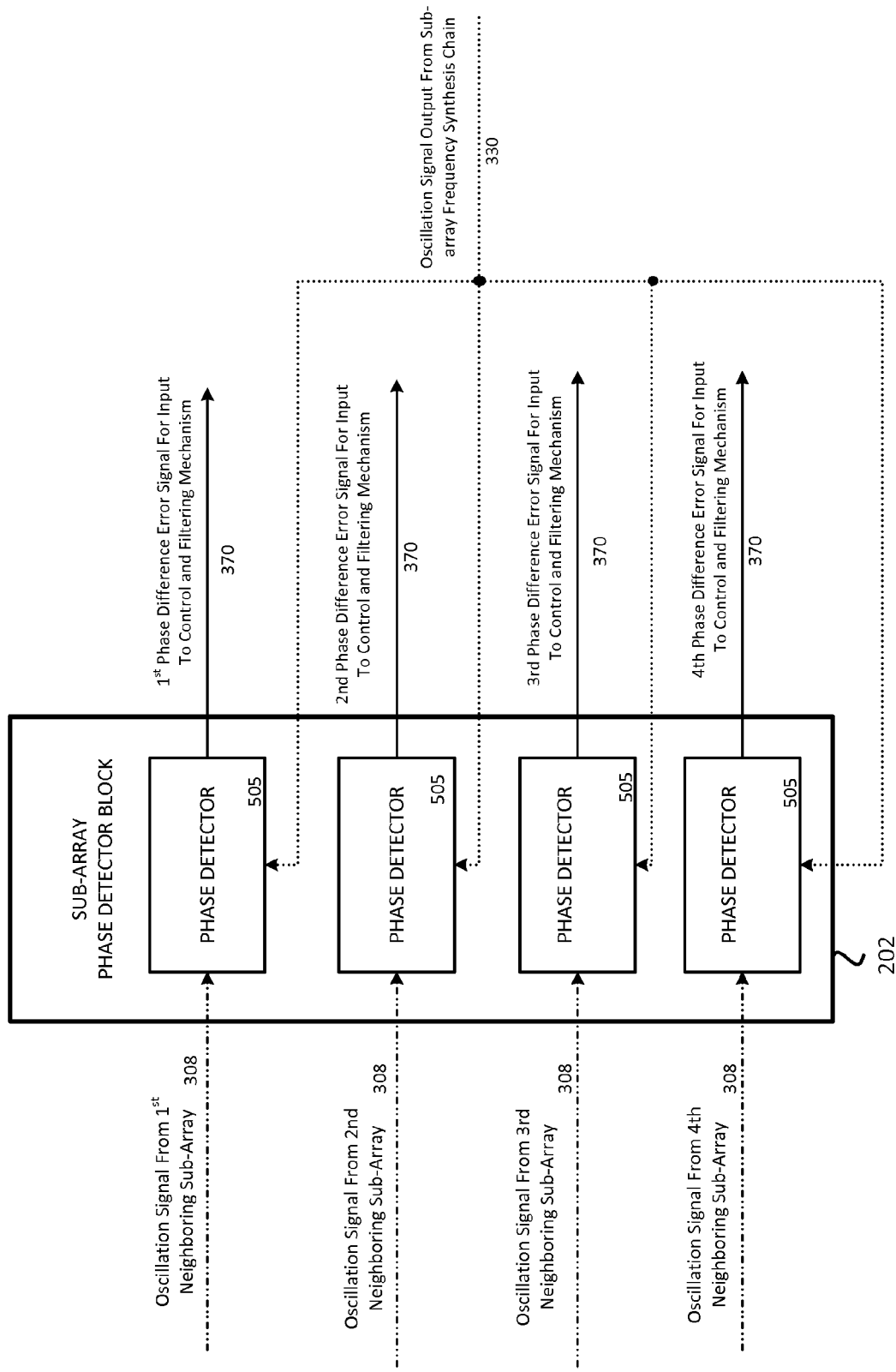
FIG. 5 illustrates an exemplary and generalized arrangement of certain components of a phased array system in which aspects of the present disclosure are incorporated.

FIG. 5 depicts the functionality of a sub-array phase detector block 202 in greater detail than in previous drawings. Throughout system 200, each of the various sub-array phase detector blocks 202 may function and be configured as illustrated in FIG. 5. However, the various sub-array phase detector blocks 202 receive different oscillator reference signals, as depicted at 308. This difference from one phase detector block 202 to the next is because, at any one phase detector block 202, the oscillator reference signals shown at 308 are the oscillation signals generated at neighboring sub-arrays 210, and are therefore determined by the location of the sub-array 210 within which the phase detector block 202 operates.

The sub-array phase detector blocks 202 may be implemented using a field programmable gate array (FPGA) or other analog or digital integrated circuit or combination of integrated circuits suitable for performing phase comparison with regards to multiple pairs of oscillation signals. As mentioned previously, within each sub-array 210, the phase detector block 202 is one element of a phase locked loop of which frequency synthesis chain 204 is also a component. As depicted in FIG. 5, the sub-array phase detector block 202 includes multiple phase detectors 505. Each of the phase detectors 505 compares the phase of the feedback carrier waveform shown at 330, and the phase of the carrier waveform generated at one of the neighboring sub-arrays 210. Each of the phase detectors 505 outputs an error signal 370 which is proportional to the phase difference between the two compared signals. Within each sub-array 210, these error signals 370 are then provided as inputs to the control and filtering module 430 within the sub-array frequency synthesis chain 204.

Figure 6:
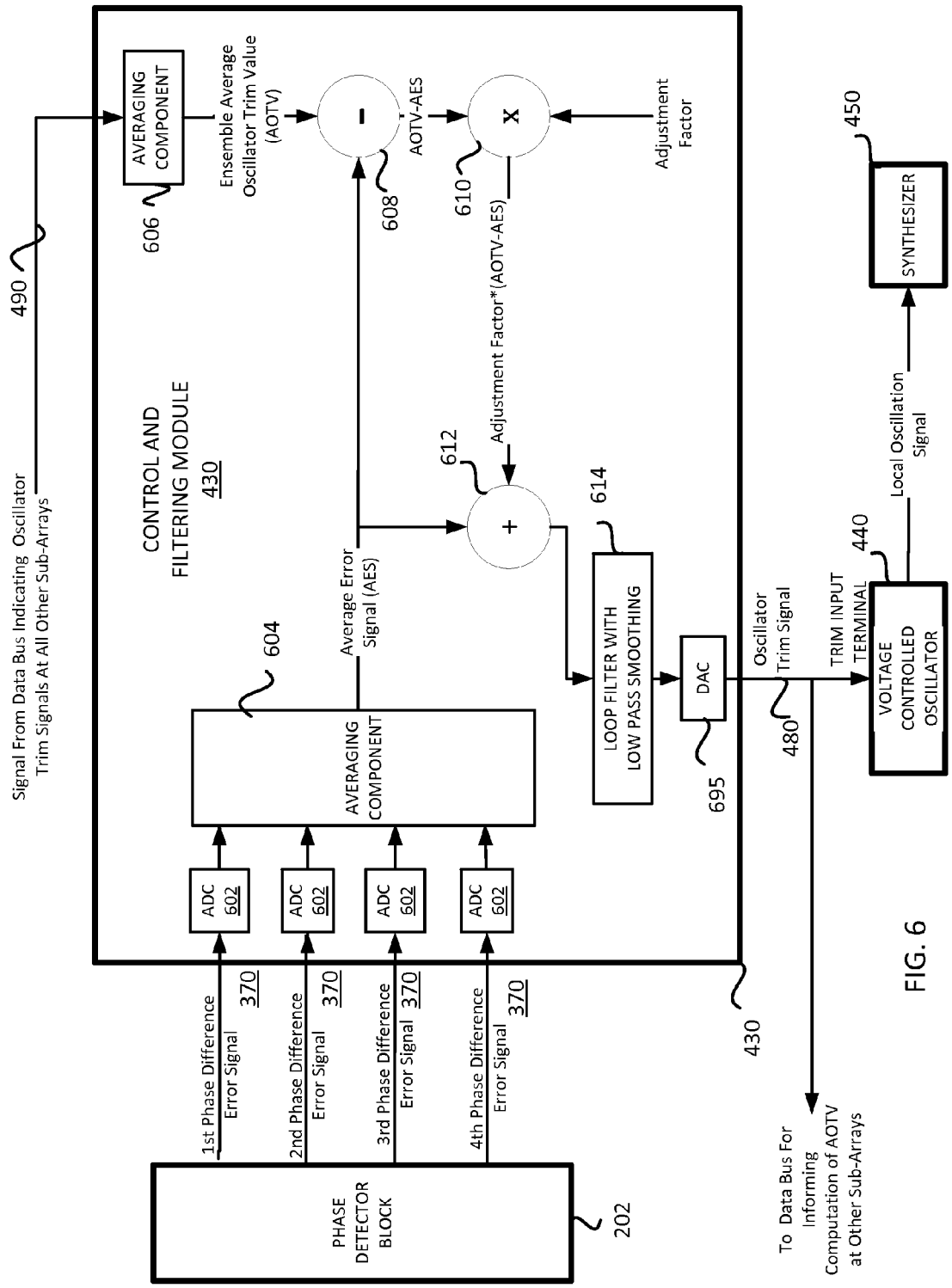
FIG. 6 illustrates an exemplary and generalized arrangement of certain components of a phased array system incorporating aspects of the present disclosure.

FIG. 6 provides a generalized depiction of the configuration and operations of a control and filtering module 430.

Only one control and filtering module 430 is depicted in FIG. 5. Nonetheless, because of the modular design of system 200, the single illustration provided in FIG. 6 may be applicable to each control and filtering module 430 in system 200. At each sub-array 210, the control and filtering module 430 may be implemented using a field programmable gate array, microcontroller, or any combination of suitable integrated circuits.

As depicted in FIG. 6, each control and filtering module 430 receives two sets of varying inputs. The first inputs are the error signal 370 outputted by the phase detector block 202 (not shown in FIG. 6) to which the control and filtering module 430 is connected. A second input is provided from the data interface 216. The second input is information 490 that indicates the various trim signal values being applied by other control and filtering modules 430 to control the frequency of the oscillation signals generated there.

The information 490 may be provided using one data stream onto which the various trim signal 480 amplitudes are encoded. Conversely, multiple parallel data streams may be used to communicate the various trim signal 480 amplitudes. In FIG. 6, the second input is represented by one data stream, as shown at 490. Thus, with regards to the depiction of the control and filtering module 430 provided in FIG. 6, the depicted information 490 may be understood to be a single continuous signal from the data interface 216 which reflects the most recent trim signals 480 being used at other sub-arrays 210 across the phased array system 200.

The control and filtering module 430 continuously performs processing operations based on the error signals 370 and information 490 to continuously adjust and control the reference oscillator 440 trim input signal 480 provided at the output of the control and filtering module 430.

As depicted at 602, each control and filtering module 430 performs analog to digital conversion of the error signals 370 provided by the phase detector block 202 to which it the module is attached. At 604, the control and filtering module 430 averages these error signals 370. The average is represented by a signal designated in FIG. 6 as the average error signal (AES).

An averaging component 606 of the control and filtering module 430 also averages the trim signals in use at other sub-arrays 210. The result of the averaging at 606 is a signal representing what will be referred to as the ensemble average oscillator trim value (AOTV). At 608, the control and filtering module 430 subtracts the AOTV from a reference voltage (Vref). The reference voltage (Vref) represents the nominal center frequency trim voltage characteristic of the reference oscillators 440 used throughout the system. The subtractor at 608 is configured to provide a negative or positive difference output, depending on which of the input signal values is larger.

Next, at 610, a multiplication operation is performed. In the multiplication operation, the signal resulting from the subtraction operation at 608 is reduced by being multiplied by an adjustment factor. In the formula shown at 610, the adjustment factor is design parameter having a constant value. The adjustment factor may be hard coded into the control and filtering module 430.

The adjustment factor is a primary determinant of the responsiveness of the local oscillator trim 480 signal to phase and frequency deviations of the local oscillator signal from the phase and frequency of the local oscillator signals at neighboring sub-arrays 210. Thus, during system design, the adjustment factor may be set and/or adjusted based on the desired performance characteristics of the phased array system 200 and in view of the tradeoffs between response time and stability inherent in frequency synchronization operations.

For example, a larger adjustment factor may lead to more rapid frequency synchronization performance, but may make the system 200 more vulnerable to instability in the event of a large noise disturbance or other abnormality. The adjustment factor should generally be greater than zero and less than one, so that the local trim signal 480 may be adjusted in the direction that will have the effect of causing the AOTV to be altered in the direction of Vref. At 612, an addition operation is performed on the multiplication output signal generated at 610. Here, the multiplier output signal generated at 610 is added to the AES, and the resultant signal is the pre-filtered local oscillator trim signal 480. An adjustment factor may also be applied to the average error signal between the output of the averaging component 604 and the adder shown at 612.

A loop filter 614 performs digital filtering of the trim signal 480. In certain phased array system embodiments of the techniques disclosed here, the loop filter 614 may include a low pass smoothing filter, or other filter or filter combination designed to eliminate noise, enhance system stability, and/or eliminate reference frequency energy from the trim signal 480.

The filtered trim signal 480 is then split. One copy of the split trim signal is provided to the data interface 216, while the other copy is converted to an analog signal at 695, and then inputted at the trim input terminal of the reference oscillator 440. In response to receiving the oscillator trim signal 480, the data interface 216 provides the data to control and filtering modules 430 in other sub-arrays 210. In this way, each sub-array 210 control and filtering module 430 is able to compute an ensemble average oscillator trim value based on the trim signal 480 at every other sub-array 210.

When the processing described above is simultaneously performed by all sub-array 210 control and filtering modules 430 in a large number of sub-arrays 210 throughout the system 200, each local oscillator may be quickly brought into synchronization with every other local oscillator generated at other sub-arrays 210. Moreover, the effect of any outlier oscillators that become substantially asynchronous with the other oscillators because of localized phase noise, frequency drift, or deviation from performance specifications will be isolated locally. Moreover, the magnitude of this stabilizing effect increases with increasing numbers of sub-arrays 210 within the phased array system.

Figure 7:
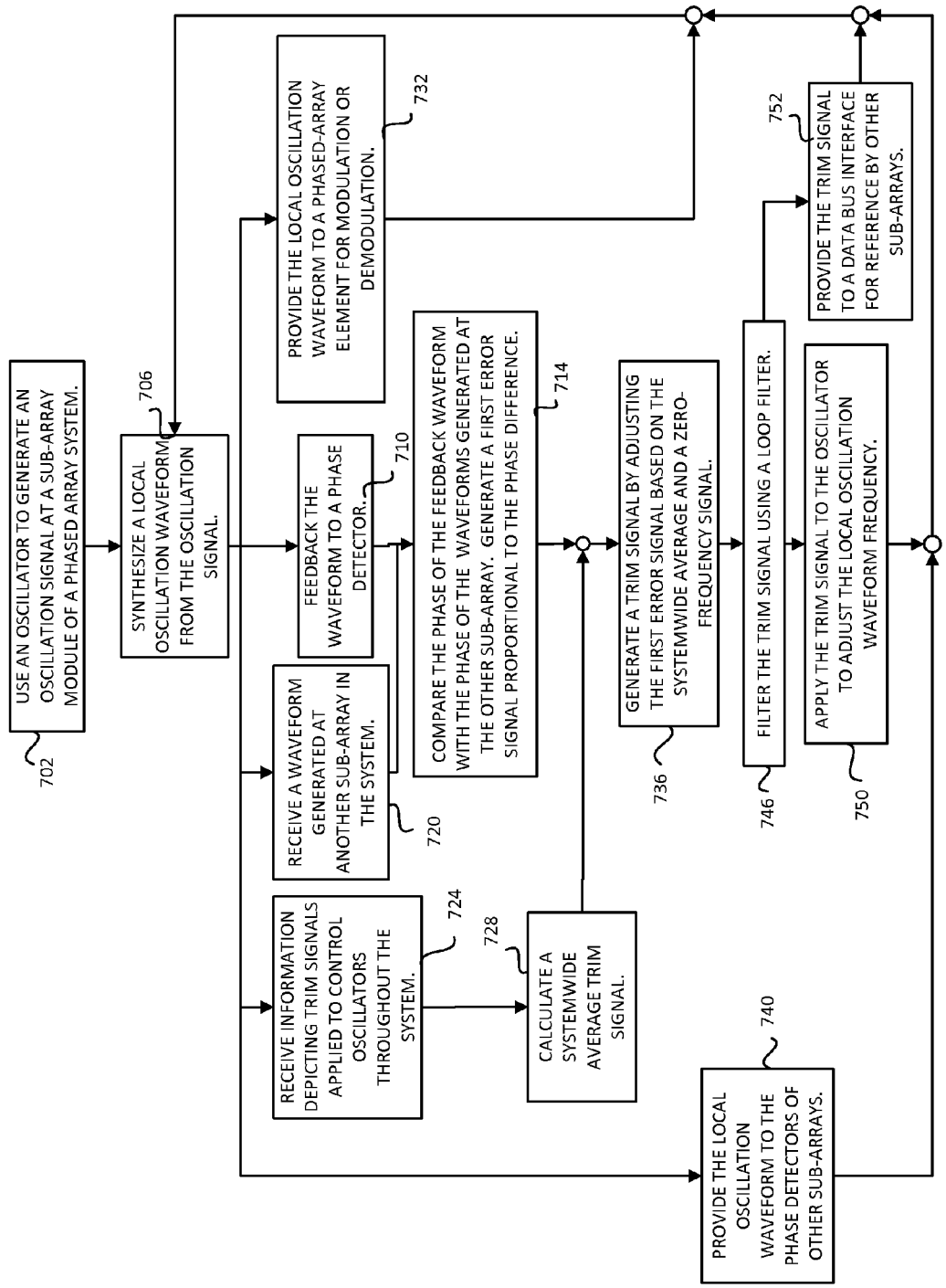
FIG. 7 is a flow diagram illustrating a process for generating, synchronizing and phase-locking an oscillation signal with other oscillation signals.

FIG. 7 is a flow diagram depicting operations associated with generating, synchronizing and phase-locking an oscillation signal generated at a sub-array 210. The flow diagram depicts several parallel process. For this reason, the discussion of the flow diagram will refer only to specific steps in the diagram, and will not attempt to explain any ordering of steps. Rather, the order of steps in the diagram may be understood by reference to FIG. 7 itself.

As depicted at 702, reference oscillator 440 is used to generate an oscillation signal at a sub-array 210 of a phased array system 200. At 706, a local oscillator waveform is synthesized from the oscillation signal generated at 702. The local oscillation waveform is provided to a transmit or receive array element 250, 252 for modulation or demodulation, as depicted at 732. Also, at 710 the local oscillation waveform is fed back to a phase detector at the sub-array 210. At 720, another local oscillation waveform generated at another sub-array 210 in the system 200 is received. At 724, information regarding trim signals is received. The information represents trim signals used to control reference oscillators throughout the system 200. Based on the received information, a system-wide average trim signal is calculated at 728. At 740, the waveform synthesized at 706 is provided to the phase detector blocks 202 of other sub-arrays 210.

At 714, the phase of the feedback local oscillator waveform is compared with the phase of the local oscillator signals generated at the other sub-array 210. A first error signal proportional to the phase difference is generated. At 736, a trim signal is generated by adjusting the first error signal in a direction that will cause the system-wide average trim signal to be altered in the direction of Vref. At 746, the trim signal is filtered using a loop filter, and then is applied to the oscillator so as to adjust the oscillation frequency at 750. Meanwhile, at 752, the trim signal is provided to a data bus interface for reference by other sub-arrays. The process may be continuously repeated without interruption, as indicated by the arrow showing a return to 706.

Specific details are given in the above description to provide a thorough understanding of the various embodiments of the described methods, techniques and systems. However, it is understood that certain such embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels, and/or various other storage mediums capable of storing that contain or carry instruction (s) and/or data.

While the principles of the disclosure have been described above in connection with specific apparatuses and methods, it is to be clearly understood that this description is made only by way of example and not as limitation on the scope of the disclosure.

What is claimed is:

1. A method for frequency-synchronizing and phase-locking carrier signals in a phased array system, the system including multiple antennas, and the method comprising:
    tuning multiple array elements to a common carrier frequency, wherein each of the array elements is tuned by:
        synchronizing a phase and frequency of a locally generated oscillation signal with other oscillation signals used in the system, and wherein synchronizing includes:
            determining a phase difference between the locally generated oscillation signal and at least one of the other oscillation signals;
            providing an error signal that represents the phase difference;
            obtaining information regarding oscillator trim signals applied with respect to the other oscillation signals;
            generating a local oscillator trim signal, wherein the local oscillator trim signal is generated based on the error signal and the obtained information; and
            adjusting a frequency of the locally generated oscillation signal by applying the local oscillator trim signal; and
    transmitting information at the antennas, wherein the information is transmitted using the common carrier frequency.

2. The method of claim 1, wherein, at each of the tuned array elements, the locally generated oscillation signal is modulated and phased shifted.

3. The method of claim 1, wherein, with respect to each of the tuned array elements, the locally generated oscillation signal is phase locked with the other of the locally generated oscillation signals.

4. The method of claim 1, wherein synchronizing further includes:
communicating information regarding the local oscillator trim signal, wherein the oscillator trim signals applied with respect to the other oscillation signals are adjusted based on the communicated information.

5. A phased array communication system comprising:
multiple sub-array modules collectively configured to facilitate transmitting a beam on a carrier frequency, wherein each of the sub-array modules includes:
a transmit antenna;
an oscillator configured to generate an oscillation signal;
a control element configured to phase lock the oscillation signal with other oscillation signals used in the system, and wherein the control element is further configured to:
determine a phase difference between the oscillation signal and another oscillation signal generated in the system;
provide an error signal that indicates the phase difference;
obtain information regarding oscillator trim signals applied with respect to other oscillation signals generated in the system;
generate an oscillator trim signal based on the error signal and the obtained information; and
adjust a frequency of the oscillation signal by applying the oscillator trim signal;
a modulator component configured to provide a modulated carrier waveform by modulating an oscillation signal phase locked by the control element; and
a transmit component configured to transmit a modulated carrier waveform provided by the modulator component.

6. The apparatus of claim 5, wherein the control element is further configured to:
communicate the oscillator trim signal such that the oscillator trim signal is accessible to other control elements in the system.

7. The apparatus of claim 5, wherein each of the sub-array modules further includes:
a phase detector configured to detect a phase difference between two oscillation signals and generate an output representative of the phase difference.

8. The apparatus of claim 7, wherein, with respect to each of the sub-array modules, the control element is further configured to:
generate an error signal based on outputs generated by the phase detector.

9. The apparatus of claim 8, wherein, with respect to each of the sub-array modules, the control element includes an encoded field programmable gate array.

10. The apparatus of claim 5, wherein each of the sub-array modules further includes:
a tunable frequency synthesizer configured to generate a waveform having a frequency equal to the carrier frequency.

11. The apparatus of claim 10, wherein, with respect to each of the sub-array modules, the tunable frequency synthesizer is coupled to the oscillator and is further configured to generate the waveform by using an oscillation signal generated by the oscillator.

12. The apparatus of claim 5, wherein each of the multiple sub-arrays further includes:
a loop filtering element configured to filter a local oscillator trim signal generated by the control element.

13. The apparatus of claim 12, wherein, with respect to each of the multiple sub-arrays, the loop filtering element is configured to filter the local oscillator trim signal by performing smoothing.

14. A phased array system comprising:
multiple sub-array modules collectively configured to receive a beam transmitted at a carrier frequency, wherein each of the sub-array modules includes:
a receive antenna;
an oscillator configured to generate an oscillation signal;
a control element configured to phase lock the oscillation signal with other oscillation signals used in the system, and wherein the control element is further configured to:
determine a phase difference between the oscillation signal and at least one of the other oscillation signals used in the system;
generate an error signal that represents the phase difference;
obtain information regarding oscillator trim signals applied with respect to other oscillation signals generated in the system; and
generate a local oscillator trim signal based on the error signal and the obtained information; and
adjust a frequency of the oscillation signal using the generated local oscillator trim signal; and
a receiver component configured to demodulate received signals by using an oscillation signal phase locked by the control element.

15. The apparatus of claim 14, wherein, with respect to each of the sub-array modules, the control element is further configured to:
communicate the local oscillator trim signal such that the local oscillator trim signal is accessible by other control elements in the system.

16. The apparatus of claim 15, wherein each of the sub-array modules further includes:
at least one phase detector configured to detect a phase difference between two oscillation signals and generate an output representative of the phase difference.

17. The apparatus of claim 16, wherein, with respect to each of the sub-array modules, the control element is further configured to:
generate the average error signal based on outputs generated by the phase detector.

18. The apparatus of claim 17, wherein, with respect to each of the sub-array modules, the control element includes an encoded field programmable gate array.

19. The apparatus of claim 15, wherein each of the sub-array modules further includes:
a tunable frequency synthesizer configured to generate waveforms at a tuned carrier frequency.

20. The apparatus of claim 19, wherein:
with respect to each of the sub-array modules, the tunable frequency synthesizer is coupled to the oscillator and is further configured to generate the waveforms using a local oscillation signal generated by the oscillator; and
each of the multiple sub-arrays further includes a loop filtering element configured to filter a local oscillator trim signal generated by the control element.

* * * * *